United States Patent
Yatsuda et al.

(10) Patent No.: US 11,120,999 B2
(45) Date of Patent: Sep. 14, 2021

(54) PLASMA ETCHING METHOD

(71) Applicants: TOKYO ELECTRON LIMITED, Tokyo (JP); UNIVERSITE D'ORLEANS, Orleans (FR)

(72) Inventors: Koichi Yatsuda, Tokyo (JP); Kaoru Maekawa, Albany, NY (US); Nagisa Sato, Tokyo (JP); Kumiko Ono, Tokyo (JP); Shigeru Tahara, Miyagi (JP); Jacques Faguet, Austin, TX (US); Remi Dussart, Saint-Mesmin (FR); Thomas Tillocher, Orleans (FR); Philippe Lefaucheux, Mareau-aux-pres (FR); Gaëlle Antoun, Dardilly (FR)

(73) Assignees: TOKYO ELECTRON LIMITED, Tokyo (JP); UNIVERSITE D'ORLEANS, Orleans (FR)

( * ) Notice: Subject to any disclaimer, the term of this patent is extended or adjusted under 35 U.S.C. 154(b) by 0 days.

(21) Appl. No.: 16/770,084

(22) PCT Filed: Dec. 11, 2018

(86) PCT No.: PCT/JP2018/045461
§ 371 (c)(1),
(2) Date: Jun. 5, 2020

(87) PCT Pub. No.: WO2019/117130
PCT Pub. Date: Jun. 20, 2019

(65) Prior Publication Data
US 2020/0381264 A1 Dec. 3, 2020

(30) Foreign Application Priority Data
Dec. 15, 2017 (JP) .............................. JP2017-240333

(51) Int. Cl.
*H01L 21/311* (2006.01)
*H01L 21/3065* (2006.01)
*H01J 37/32* (2006.01)

(52) U.S. Cl.
CPC .... *H01L 21/31116* (2013.01); *H01L 21/3065* (2013.01); *H01J 37/3244* (2013.01);
(Continued)

(58) Field of Classification Search
CPC ........... H01L 21/31116; H01L 21/3065; H01L 21/30655; H01L 21/67069;
(Continued)

(56) References Cited

U.S. PATENT DOCUMENTS

| | | | |
|---|---|---|---|
| 2016/0135274 A1 | 5/2016 | Fischer et al. | |
| 2017/0018405 A1 | 1/2017 | Kobayashi et al. | |

(Continued)

FOREIGN PATENT DOCUMENTS

| | | |
|---|---|---|
| JP | 03-138369 A | 6/1991 |
| JP | 03-263827 A | 11/1991 |

(Continued)

OTHER PUBLICATIONS

International Search Report and Written Opinion dated Feb. 5, 2019 for PCT/JP2018/045461 filed on Dec. 11, 2018, 10 pages including English Translation of the International Search Report.

(Continued)

*Primary Examiner* — Anita K Alanko
(74) *Attorney, Agent, or Firm* — Xsensus LLP (57) ABSTRACT

A plasma etching method includes a physisorption step for causing an adsorbate that is based on first processing gas to be physisorbed onto a film to be etched, while cooling an object to be processed on which the film to be etched is provided; and an etching step for etching the film to be etched by causing the adsorbate to react with the film to be etched, using the plasma of second processing gas.

7 Claims, 10 Drawing Sheets

(52) U.S. Cl.
    CPC . *H01J 2237/2001* (2013.01); *H01J 2237/334* (2013.01); *H01L 21/30655* (2013.01)

(58) Field of Classification Search
    CPC ............ H01L 21/67109; H01J 37/3244; H01J 2237/2001; H01J 2237/334
    See application file for complete search history.

(56) References Cited

U.S. PATENT DOCUMENTS

| | | | | |
|---|---|---|---|---|
| 2018/0174860 A1* | 6/2018 | Kanarik | .............. | H01L 21/6831 |
| 2018/0226260 A1* | 8/2018 | Romm | .............. | H01L 21/31116 |

FOREIGN PATENT DOCUMENTS

| | | |
|---|---|---|
| JP | 03-276719 A | 12/1991 |
| JP | 05-217949 A | 8/1993 |
| JP | 07-106305 A | 4/1995 |
| JP | 2015-173240 A | 10/2015 |
| JP | 2017-028001 A | 2/2017 |

OTHER PUBLICATIONS

Extended European search report dated Jul. 27, 2021, in corresponding European patent Application No. 18889001.6, 8 pages.
Hiroyuki Sakaue et al., "Atomic Layer Controlled Digital Etching of Silicon", Japanese Journal of Applied Physics, vol. 29, No. 11, Nov. 1990, pp. 2648-2652.

* cited by examiner

| Temperature (°C) | a-Si (nm) | SiO2 (nm) | SiN (nm) |
|---|---|---|---|
| 20 | 0.214 | 1.146 | -0.612 |
| 0 | 0.912 | -13.654 | -1.26 |
| -25 | 0.712 | -11.254 | -0.071 |
| -50 | 51.612 | -14.254 | 7.7 |

FIG.10

PLASMA ETCHING METHOD

CROSS-REFERENCE TO RELATED APPLICATIONS

The present application is based on PCT filing PCT/JP2018/045461, filed Dec. 11, 2018, which claims priority to JP 2017-240333, filed Dec. 15, 2017, the entire contents of each are incorporated herein by reference.

FIELD

Various aspects and embodiments of the present invention relate to a plasma etching method and a plasma etching apparatus.

BACKGROUND

As one type of technique for etching a film to be etched, an atomic layer etching (ALE) technique, in which the film to be etched is etched in a unit of one atomic layer, has been known.

As the ALE technique, techniques referred to as real-ALE technique and quasi-ALE technique have been disclosed. In the real-ALE technique, a film to be etched is etched by causing the film to be etched to chemisorb active species that are based on processing gas, and causing the active species to react with the film to be etched, using noble-gas plasma. In the quasi-ALE, a film to be etched is etched by causing a polymer layer that is based on processing gas to deposit on the film to be etched, and causing the polymer layer to react with the film to be etched, using noble-gas plasma.

CITATION LIST

Patent Literature

Patent Literature 1: Japanese Laid-open Patent Publication No. H3-263827
Patent Literature 2: Japanese Laid-open Patent Publication No. 2015-173240

SUMMARY

Technical Problem

However, in the real-ALE technique, limitations are imposed on usable processing gas, and on materials used for the parts inside of the etching chamber designed to handle the processing gas because, in order to allow the film to be etched to chemisorb the active species that are based on the processing gas, the temperature of the substrate is raised so that the selectable film to be etched exhibits chemical reactivity to the processing gas, or because the reactivity is increased by using plasma. Furthermore, when plasma is used, the plasma may react with the parts inside of the etching chamber, and change the performance of the etching process.

Furthermore, in the quasi-ALE, because it is difficult to control the thickness by which the polymer layer is deposited on the film to be etched, in a unit of one atomic layer, it is difficult to control the etch amount of the film to be etched in a unit of one atomic layer. As a result, an implementation of self-limiting etching is not possible with the quasi-ALE technique. Furthermore, the polymer layer to be deposited is usually deposited on the film to be etched by dissociating fluorocarbon gas using plasma, but the polymer layer may also become deposited on the parts inside of the etching chamber, and change the performance of the etching process.

Solution to Problem

A plasma etching method includes a physisorption step for causing an adsorbate that is based on first processing gas to be physisorbed onto a film to be etched, while cooling an object to be processed on which the film to be etched is provided; and an etching step for etching the film to be etched, by causing the adsorbate to react with the film to be etched, using plasma of second processing gas.

Advantageous Effects of Invention

According to one aspect of the plasma etching method disclosed herein, an implementation of self-limiting etching, with no limitation on the film to be etched, is made possible, advantageously.

DESCRIPTION OF EMBODIMENTS

Various embodiments will now be explained in detail with reference to some drawings. In the drawings, the same reference signs will be assigned to the same parts or equivalent parts.

[Structure of Plasma Etching Apparatus]

Figure 1:
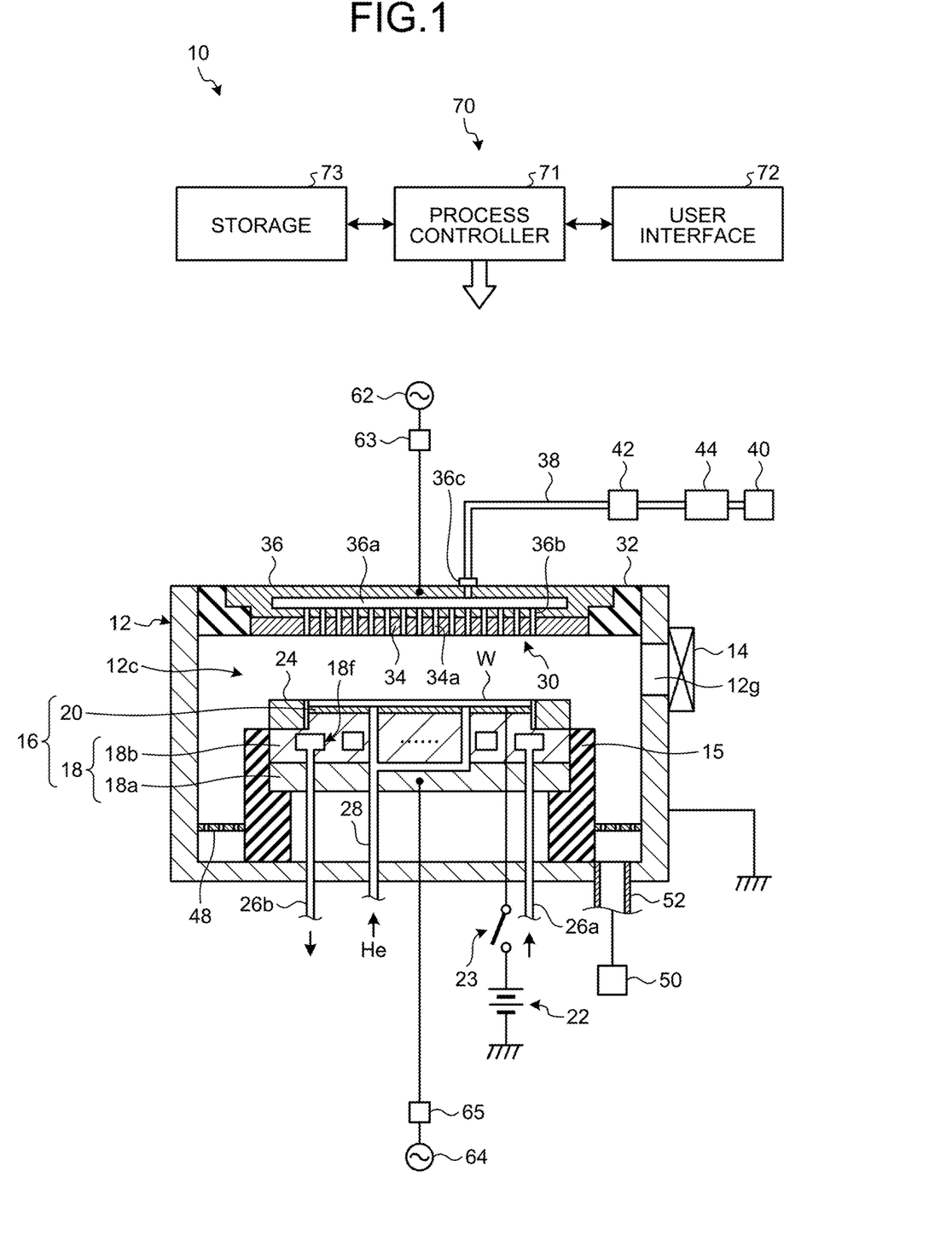
FIG. 1 is a schematic generally illustrating one example of a cross section of a plasma etching apparatus according to one embodiment.

A plasma etching apparatus according to one embodiment will now be explained based on FIG. 1. FIG. 1 is a schematic generally illustrating one example of a cross section of a plasma etching apparatus 10 according to one embodiment. The plasma etching apparatus 10 illustrated in FIG. 1 is a capacitively coupled plasma etching apparatus.

The plasma etching apparatus 10 includes a chamber main body 12. The chamber main body 12 has a substantially cylindrical shape. The internal space of the chamber main body 12 is provided as a chamber 12c. The inner wall of the chamber main body 12 is applied with a plasma-resistant film. This film may be an alumite film, or a film made of yttrium oxide. The chamber main body 12 is grounded. An opening 12g is provided on the side wall of the chamber main body 12. When a wafer W is carried from external of the chamber main body 12 into the chamber 12c, and when the wafer W is carried from the chamber 12c to the external of the chamber main body 12, the wafer W passes through the opening 12g. A gate valve 14 is mounted on the side wall of the chamber main body 12 to open and to close the opening 12g.

A support 15 is provided on the bottom of the chamber main body 12. The support 15 has a substantially cylindrical shape. The support 15 is made of an insulating material, for example. The support 15 extends upwards from the bottom of the chamber main body 12 inside the chamber 12c. A stage 16 is provided inside the chamber 12c. The stage 16 is supported by the support 15.

The stage 16 is configured to hold the wafer W placed thereon. The stage 16 includes a lower electrode 18 and an electrostatic chuck 20. The lower electrode 18 includes a first plate 18a and a second plate 18b. The first plate 18a and the second plate 18b are made of metal such as aluminum, and have a substantially disk-like shape. The second plate 18b is provided on the first plate 18a, and is electrically connected to the first plate 18a.

The electrostatic chuck 20 is provided on the second plate 18b. The electrostatic chuck 20 includes an insulating layer, and a film-like electrode that is provided inside the insulating layer. To the electrode of the electrostatic chuck 20, a direct-current (DC) power source 22 is electrically connected via a switch 23. To the electrode of the electrostatic chuck 20, a DC voltage is applied from the DC power source 22. When a DC voltage is applied to the electrode of the electrostatic chuck 20, the electrostatic chuck 20 generates electrostatic attraction, and holds the wafer W by attracting the wafer W onto the electrostatic chuck 20. The electrostatic chuck 20 may be provided with an internal heater, and a heater power source provided external of the chamber main body 12 may be connected to the heater.

A focus ring 24 is provided along the circumferential edge of the second plate 18b. The focus ring 24 is a plate having a substantially annular shape. The focus ring 24 is disposed in a manner surrounding the edge of the wafer W, and the electrostatic chuck 20. The focus ring 24 is provided to improve etching uniformity. The focus ring 24 may be made of a material such as silicon or quartz.

A flow channel 18f is provided inside the second plate 18b. Refrigerant is supplied from a chiller unit provided external of the chamber main body 12 into the flow channel 18f, via a pipe 26a. The refrigerant supplied into the flow channel 18f is returned to the chiller unit via the pipe 26b. In other words, refrigerant is circulated between the flow channel 18f and the chiller unit. By controlling the temperature of this refrigerant, the temperature of the stage 16 (or the electrostatic chuck 20) and the temperature of the wafer W are adjusted. One example of the refrigerant includes Galden (registered trademark).

The plasma etching apparatus 10 is provided with a gas supply line 28. The gas supply line 28 supplies heat-transfer gas, such as He gas, supplied from a heat-transfer gas supply mechanism into the space between the upper surface of the electrostatic chuck 20 and the rear surface of the wafer W.

The plasma etching apparatus 10 is also provided with an upper electrode 30. The upper electrode 30 is provided above the stage 16. The upper electrode 30 is supported in the upper part of the chamber main body 12 via a member 32. The upper electrode 30 may include an electrode plate 34 and a support body 36. The bottom surface of the electrode plate 34 faces the chamber 12c. The electrode plate 34 is provided with a plurality of gas discharge holes 34a. This electrode plate 34 may be made of a material such as silicon or silicon oxide.

The support body 36 is configured to support the electrode plate 34 in a removable manner, and is made of a conductive material such as aluminum. A gas diffusion chamber 36a is provided inside the support body 36. A plurality of gas passage holes 36b communicating with the gas discharge holes 34a extend downwards from the gas diffusion chamber 36a. The support body 36 is provided with a gas inlet 36c for guiding the gas into the gas diffusion chamber 36a. To the gas inlet 36c, a gas supply pipe 38 is connected.

A gas source group 40 is connected to the gas supply pipe 38 via a valve group 42 and a flow controller group 44. The gas source group 40 includes a plurality of gas sources. The gas sources at least include a gas source of first processing gas, and a gas source of second processing gas. The first processing gas is gas that is caused to be physisorbed onto the film to be etched, on the wafer W. The second processing gas is gas used in etching the film to be etched. The gas sources may also include a gas source other than those of the first processing gas and the second processing gas.

The valve group 42 includes a plurality of valves, and the flow controller group 44 includes a plurality of flow controllers such as mass flow controllers or pressure-regulating flow controllers. Each of the gas sources included in the gas source group 40 is connected to the gas supply pipe 38 via the corresponding valve in the valve group 42, and via the corresponding flow controller in the flow controller group 44.

A baffle member 48 is provided between the support 15 and the side wall of the chamber main body 12. The baffle member 48 is a plate-like member, for example, and may be a base material made of aluminum the surface of which is covered with a ceramic such as Y2O3. The baffle member 48 has a plurality of holes passing through the baffle member 48. Below the baffle member 48, an exhaust device 50 is connected to the bottom of the chamber main body 12, via an exhaust pipe 52. The exhaust device 50 has a pressure regulator such as a pressure regulating valve, and a vacuum pump such a turbo-molecular pump, and is capable of reducing the pressure inside of the chamber 12c to a desired pressure.

The plasma etching apparatus 10 is also provided with a first high-frequency power source 62 and a second high-frequency power source 64. The first high-frequency power source 62 is a power source for generating first high-frequency power (high-frequency electric energy) for generating plasma. The first high-frequency power has a frequency within a range of 27 MHz to 100 MHz, for example. The first high-frequency power source 62 is connected to the upper electrode 30 via a matching device 63. The matching device 63 has a circuit for matching the output impedance of the first high-frequency power source 62 to the load-side impedance (impedance on the side of the upper electrode 30). The first high-frequency power source 62 may also be connected to the lower electrode 18 via the matching device 63.

The second high-frequency power source 64 is a power source for generating second high-frequency power (high-frequency electric energy) for drawing ions onto the wafer W. The second high-frequency power has a frequency within a range of 400 kHz to 13.56 MHz, for example. The second high-frequency power source 64 is connected to the lower electrode 18 via a matching device 65. The matching device 65 has a circuit for matching the output impedance the second high-frequency power source 64 to the load-side impedance (impedance on the side of the lower electrode 18).

A control unit 70 controls the operation of the plasma etching apparatus 10 comprehensively. This control unit 70 is provided with a central processing unit (CPU), and is provided with a process controller 71 for controlling the units included in the plasma etching apparatus, a user interface 72, and a storage 73.

The user interface 72 includes a keyboard allowing a process manager to make a command input operation for managing the plasma etching apparatus, and a display for visualizing and displaying the operation status of the plasma etching apparatus, for example.

The storage 73 stores therein a control program (software) for implementing various processes executed in the plasma etching apparatus, under the control of the process controller 71, and recipes storing therein data such as processing condition data. By calling a recipe from the storage 73 using an instruction or the like entered via the user interface 72, and causing the process controller 71 to execute the recipe, as required, a desired process is performed in the plasma etching apparatus under the control of the process controller 71. It is also possible to use a control program or a recipe such as the processing condition data stored in a computer-readable recording medium (such as a hard disk, a compact disc (CD), a flexible disk, or a semiconductor memory), or to use a control program or a recipe online, by causing another apparatus to transmit the control program or the recipes via a dedicated circuit, as required, for example.

The control unit 70 controls the units included in the plasma etching apparatus 10 so as to execute a plasma etching method to be described below, for example. To explain using a specific example, the control unit 70 executes a physisorption step for causing an adsorbate that is based on the first processing gas to be physisorbed onto the film to be etched, while cooling an object to be processed on which the film to be etched is provided. The control unit 70 executes an etching step for etching the film to be etched by causing the adsorbate to react with the film to be etched, using the plasma of the second processing gas. The object to be processed herein is the wafer W, for example. The physisorption step and the etching step may be repeated alternatingly a plurality of times.

[Structure of Wafer W]

Figure 2:
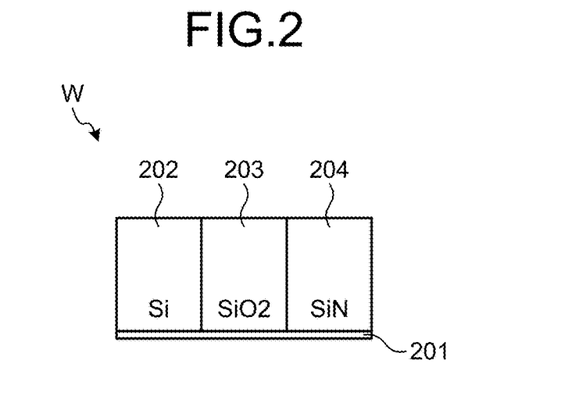
FIG. 2 is a schematic illustrating one example of a structure of a wafer.

FIG. 2 is a schematic illustrating one example of a structure of the wafer W. The wafer W has a silicon film 202, a silicon oxide film 203, and a silicon nitride film 204 on a substrate 201, as illustrated in FIG. 2, for example. The silicon film 202, the silicon oxide film 203, and the silicon nitride film 204 are arranged adjacently to one another. Among these films, the silicon film 202 and the silicon oxide film 203 are examples of the film to be etched.

[Plasma Etching Method]

Figure 3:
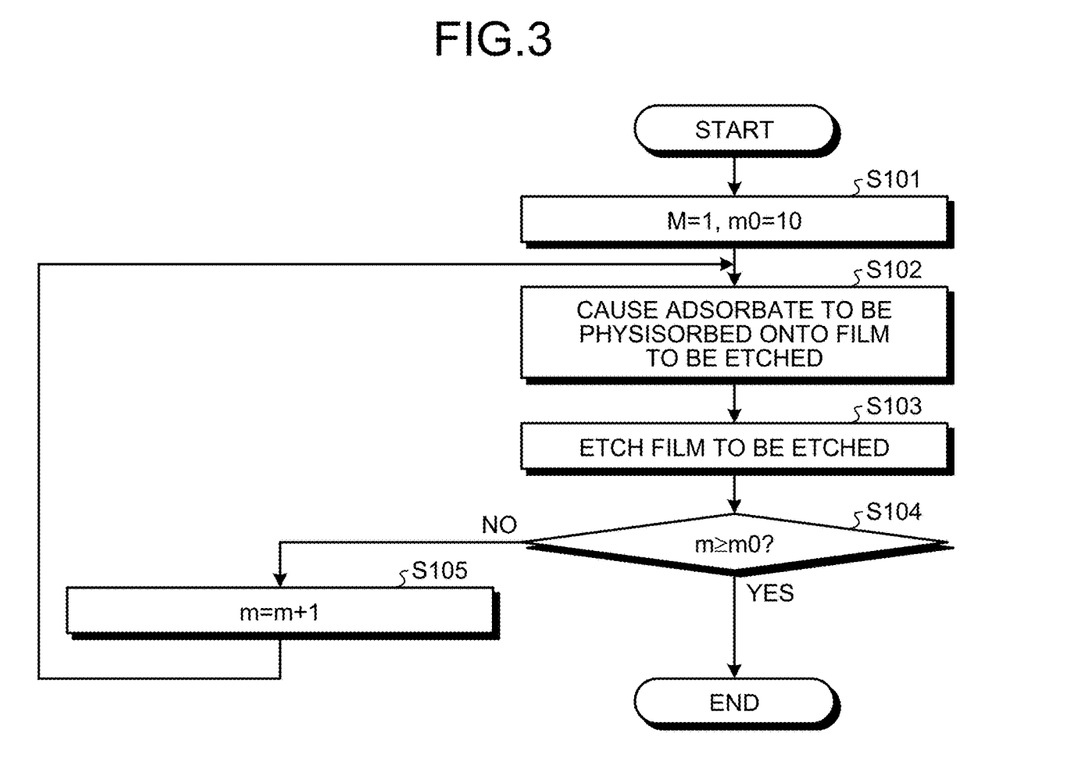
FIG. 3 is a flowchart illustrating one example of the sequence of a process of a plasma etching method according to one embodiment.
Figure 4:
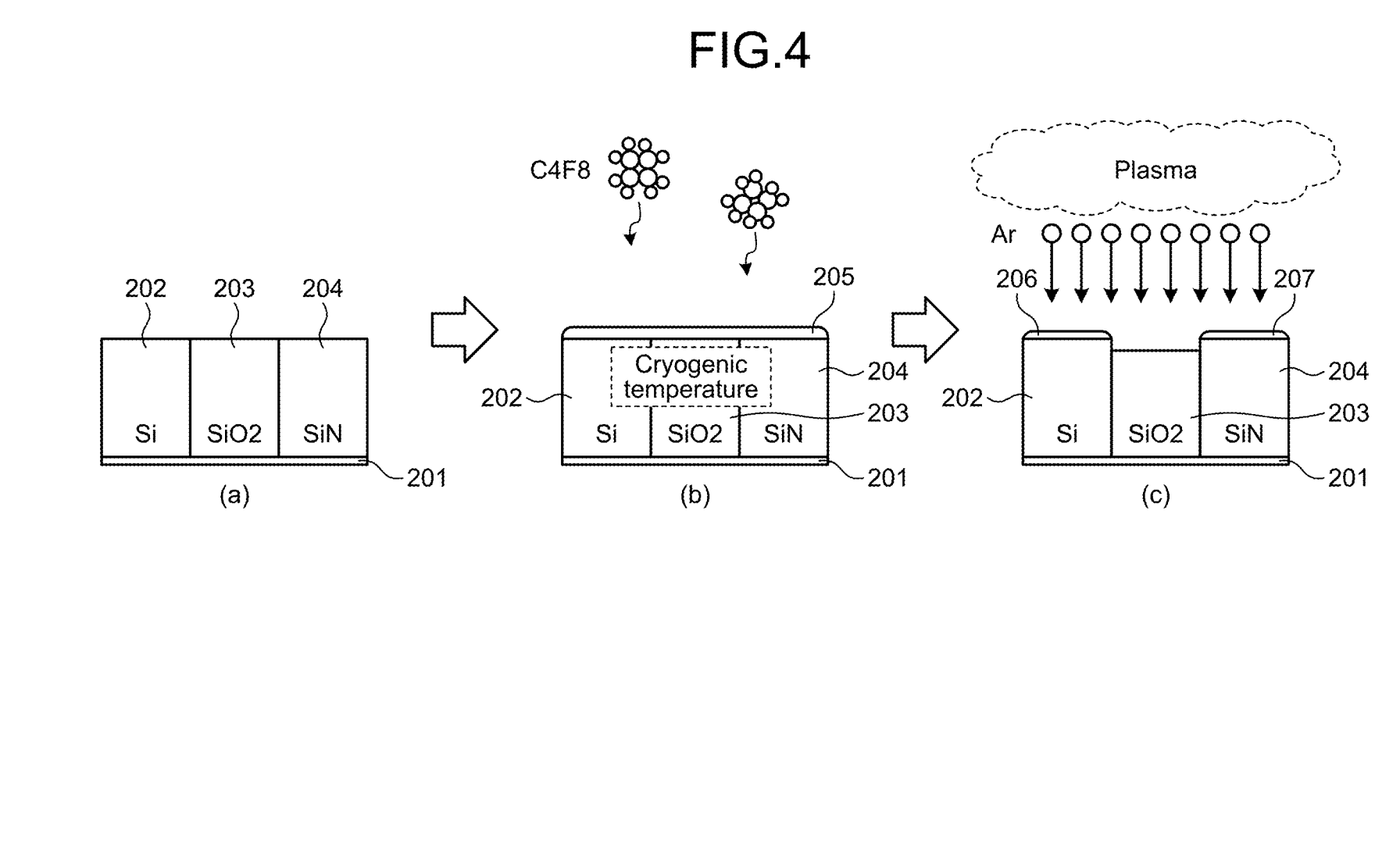
FIG. 4 is a schematic illustrating one example of a cross section of the wafer after execution of the steps illustrated in FIG. 3.

One example of the sequence of a process of the plasma etching method executed by the plasma etching apparatus 10 will now be explained. FIG. 3 is a flowchart illustrating one example of the sequence of a process of a plasma etching method according to one embodiment. FIG. 4 is a schematic illustrating one example of a cross section of the wafer W after the execution of the steps illustrated in FIG. 3. In the explanation below, it is assumed that the plasma etching apparatus 10 execute a series of steps to the wafer W illustrated in FIG. 2.

In the plasma etching method according to the embodiment, to begin with, the wafer W that is the object to be processed is carried into the chamber 12c, and is placed on the stage 16. At this point in time, the cross section of the wafer W is as illustrated in FIG. 4(a), for example.

The plasma etching apparatus 10 then sets values to a parameter m for counting the number of times the steps are repeated, and a parameter m0 specifying the upper bound of the number of times the steps are repeated. The plasma etching apparatus 10 sets "1" to the parameter m, for example, and sets "10" to the parameter m0, for example (Step S101). The value set to the parameter m0 may be any value. If the value set to the parameter m0 is "1", for example, the physisorption step and the etching step are performed once, without repeating the steps.

The plasma etching apparatus 10 then executes the physisorption step for causing the adsorbate that is based on the first processing gas to be physisorbed onto the film to be etched, while cooling the wafer W to a temperature equal to or lower than the dew point of the first processing gas (Step S102). The film to be etched is, for example, the silicon oxide film 203 on the wafer W. The first processing gas includes CF gas, for example. CF gas is, for example, $C_4F_8$ or $C_5F_8$. It is considered that the physisorption between the adsorbate that is based on the first processing gas and the film to be etched takes place due to van der Waals force, for example. Van der Waals force is a force by which molecules or atoms are attracted to one another, and the effect of this force becomes greater when the temperature of the molecules or the atoms becomes lower. Therefore, even when the film to be etched does not have any chemical reactivity to the first processing gas, by cooling the wafer W to a temperature equal to or lower than the dew point of the first processing gas, the first processing gas is caused to be physisorbed onto the film to be etched, by van der Waals force.

This step will now be explained using a more specific example. The control unit 70 in the plasma etching apparatus 10 cools the wafer W to a temperature equal to or lower than the dew point of $C_4F_8$ that is the first processing gas (hereinafter, referred to as "cryogenic temperature", as appropriate) by controlling the temperature of the refrigerant circulating through the flow channel 18f inside the stage 16. The control unit 70 then causes the gas source group 40 to supply $C_4F_8$ into the chamber 12c as the first processing gas, while keeping the wafer W at the cryogenic temperature. As a result, the adsorbate that is based on $C_4F_8$ is caused to be physisorbed onto the film to be etched, by van der Waals force, in a unit of one atomic layer.

The cross section of the wafer W after the execution of the physisorption step illustrated as Step S102 is as illustrated in FIG. 4(b), for example. In other words, by C4F8 being supplied into the chamber 12c, while the wafer W is cooled to the cryogenic temperature, the C4F8-based adsorbate 205 is caused to be physisorbed onto the silicon oxide film 203 that is the film to be etched. Because the entire wafer W is cooled to the cryogenic temperature, the C4F8-based adsorbate 205 is caused to be physisorbed onto the silicon film 202 and the silicon nitride film 204, as well as onto the silicon oxide film 203.

The plasma etching apparatus 10 then executes the etching step for etching the film to be etched, by causing the adsorbate to react with the film to be etched, using the plasma of the second processing gas (Step S103). The second processing gas includes noble gas, for example. The noble gas is Ar, for example.

This step will now be explained using a more specific example. The control unit 70 in the plasma etching apparatus 10 causes the gas source group 40 to supply Ar into the chamber 12c as the second processing gas, while cooling the wafer W to the cryogenic temperature, so as to replace C4F8 with Ar, and generates Ar plasma by causing the first high-frequency power source 62 to apply the first high-frequency power for generating plasma. At this time, the control unit 70 may also cause the second high-frequency power source 64 to apply the second high-frequency power for drawing ions. As the Ar plasma is generated, the plasma promotes the collisions of ions (that is, Ar ions) against the adsorbate on the film to be etched, and induces a reaction between the adsorbate and the film to be etched. As a result, the film to be etched is etched in a unit of one atomic layer, depending on the thickness of the adsorbate.

The cross section of the wafer W after the etching step illustrated at Step S103, is as illustrated in FIG. 4(c), for example. In other words, as the reaction is induced between the adsorbate 205 on the silicon oxide film 203 that is the film to be etched, and the silicon oxide film 203, the silicon oxide film 203 becomes etched selectively, by the thickness corresponding to the thickness of the adsorbate 205. At the same time, the reactions between the adsorbate 205, and the silicon film 202 and the silicon nitride film 204, which are not to be etched, are also induced. However, because the silicon film 202 and the silicon nitride film 204 have carbon-containing substances 206, 207, respectively, that are derived from the C4F8-based adsorbate 205, etching of the silicon film 202 and the silicon nitride film 204 is suppressed.

In other words, at the etching step illustrated at Step S103, following reactions are induced:

$SiO2+CxFy \rightarrow SiF4(Gas)+CO$ or $CO2(Gas)$ $Si3N4+CxFy \rightarrow SiF4(Gas)+NF3(Gas)+C$ or $CN(Solid)$ $Si+CxFy \rightarrow SiF4(Gas)+2C(Solid)$ The plasma etching apparatus 10 then determines whether the physisorption step and the etching step have been repeated by the preset number of times, that is, whether the parameter m is equal to or greater than the parameter m0 (Step S104). If the parameter m is less than the parameter m0 (No at Step S104), the plasma etching apparatus 10 increments the parameter m by one (Step S105), shifts the process back to Step S102, and repeats the physisorption step and the etching step. If the parameter m is equal to or greater than the parameter m0 (Yes at Step S104), the plasma etching apparatus 10 ends the process.

The order of the steps illustrated in FIG. 3 is not limited to that described above, and may be changed as appropriate, within the scope in which the steps do not contradict one another. For example, the control unit 70 may execute an adjustment step for adjusting the thickness of the adsorbate, by evaporating or subliming a part of the adsorbate having been physisorbed onto the film to be etched, between the physisorption step and the etching step.

Figure 5:
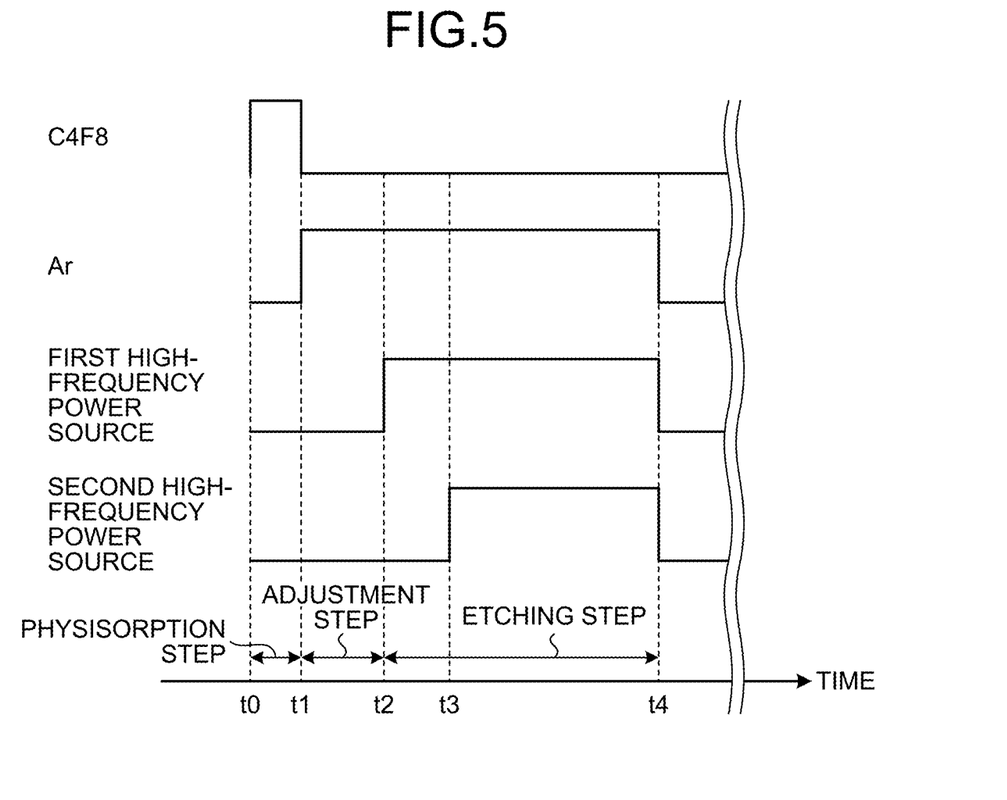
FIG. 5 is a schematic illustrating a time chart of conditions used in the plasma etching method according to one embodiment.

The plasma etching method according to one embodiment will now be explained in further detail. FIG. 5 is a schematic illustrating a time chart of conditions used in the plasma etching method according to one embodiment. Explained here is an example in which the control unit 70 in the plasma etching apparatus 10 executes the physisorption step, the adjustment step, and the etching step repeatedly, in the order listed herein, to the wafer W illustrated in FIG. 2. When the physisorption step, the adjustment step, and the etching step are executed in the order listed herein, the control unit 70 controls the timing for supplying C4F8, the timing for supplying Ar, the timing for supplying the first high-frequency power, and the timing for supplying the second high-frequency power, in accordance with the time chart illustrated in FIG. 5.

To begin with, the control unit 70 executes the physisorption step for causing the C4F8-based adsorbate 205 to be physisorbed onto the silicon oxide film 203, while cooling the wafer W to a temperature equal to or lower than the dew point of C4F8 (that is, "cryogenic temperature"). Specifically, the control unit 70 supplies C4F8 for a period between time "t0" and time "t1", while keeping the wafer W at the cryogenic temperature, illustrated in FIG. 5. As a result, the C4F8-based adsorbate 205 is caused to be physisorbed onto the silicon oxide film 203. The period between the time "t0" and the time "t1" may be about 2 seconds, for example.

The control unit 70 then executes the adjustment step for adjusting the thickness of the adsorbate 205 by evaporating or subliming a part of the adsorbate 205 having been physisorbed, as adsorbate, onto the silicon oxide film 203. Specifically, the control unit 70 stops supplying C4F8, and starts supplying Ar at the time "t1", as illustrated in FIG. 5. As a result, C4F8 is replaced with Ar, and the partial pressure of C4F8 is reduced for a period between the time "t1" and at time "t2". When the partial pressure of C4F8 is reduced, a part of the C4F8-based adsorbate 205 having been physisorbed onto the silicon oxide film 203 vaporizes. As a result, the thickness of the C4F8-based adsorbate 205 is adjusted to a predetermined thickness (e.g., the thickness corresponding to one atomic layer). The period between the time "t1" and the time "t2" may be about 10 seconds, for example.

The control unit 70 then executes the etching step for etching the silicon oxide film 203, by causing the adsorbate 205, having been physisorbed as the adsorbate, to react with the silicon oxide film 203, using Ar plasma. Specifically, the control unit 70 generates Ar plasma by applying the first high-frequency power, for a period between the time "t2" and at time "t4", as illustrated in FIG. 5, while keeping cooling the wafer W and supplying Ar. The control unit 70 also draws ions in the plasma into the wafer W by applying the second high-frequency power for a period between time "t3" and the time "t4". As the Ar plasma is generated, the plasma promotes collisions of the ions (that is, Ar ions) against the adsorbate 205 on the silicon oxide film 203, and induces the reaction between the C4F8-based adsorbate 205 and the silicon oxide film 203. As a result, the film to be etched is etched in a unit of one atomic layer, depending on the thickness of the C4F8-based adsorbate 205. The period between the time "t2" and the time "t4" may be about 25 seconds, for example, and the period between the time "t3" and the time "t4" may be about 20 seconds, for example.

The control unit 70 then executes the physisorption step, the adjustment step, and the etching step, a plurality of times, in the order listed herein.

Figure 6A:
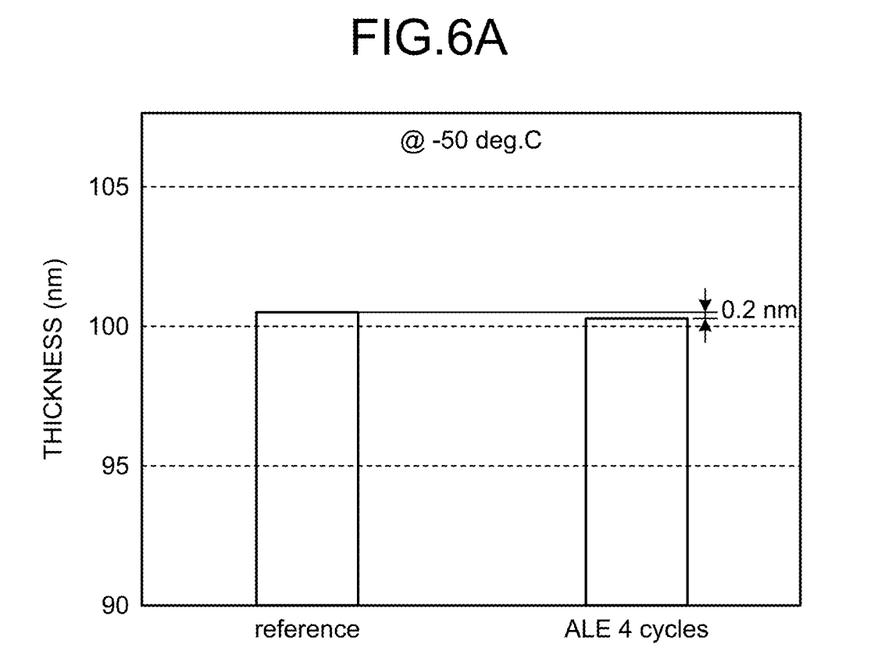
FIG. 6A is a schematic illustrating a measurement result of the etch amount of a silicon oxide film, after a cycle of a physisorption step, an adjustment step, and an etching step was repeated four times, in the order listed herein, with the wafer cooled to −50° C.
Figure 6B:
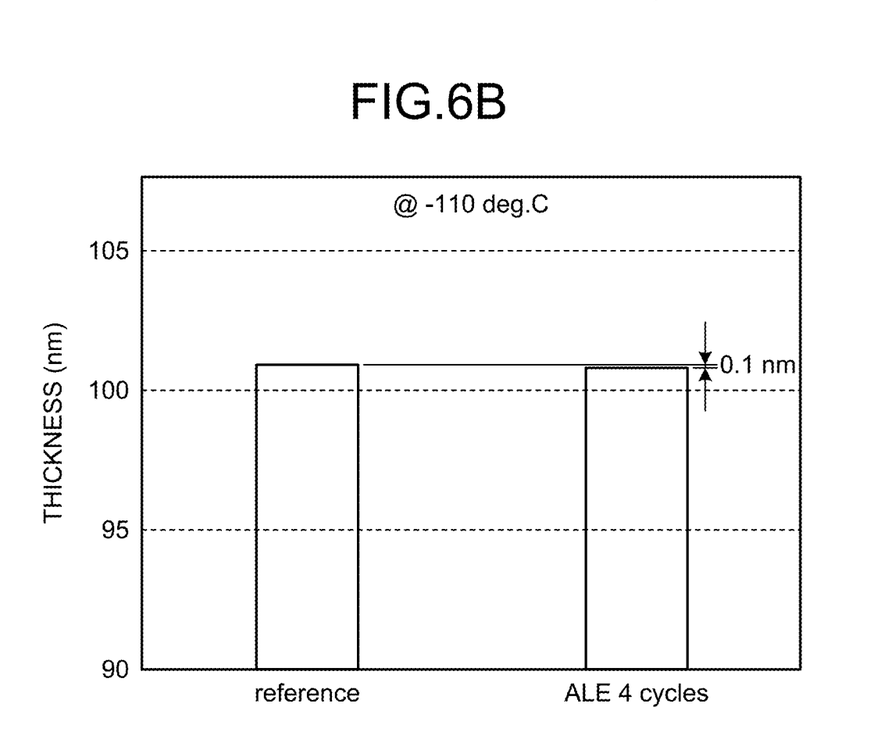
FIG. 6B is a schematic illustrating a measurement result of the etch amount of the silicon oxide film, after the cycle of the physisorption step, the adjustment step, and the etching step was repeated four times, in the order listed herein, with the wafer cooled to −110° C.
Figure 6C:
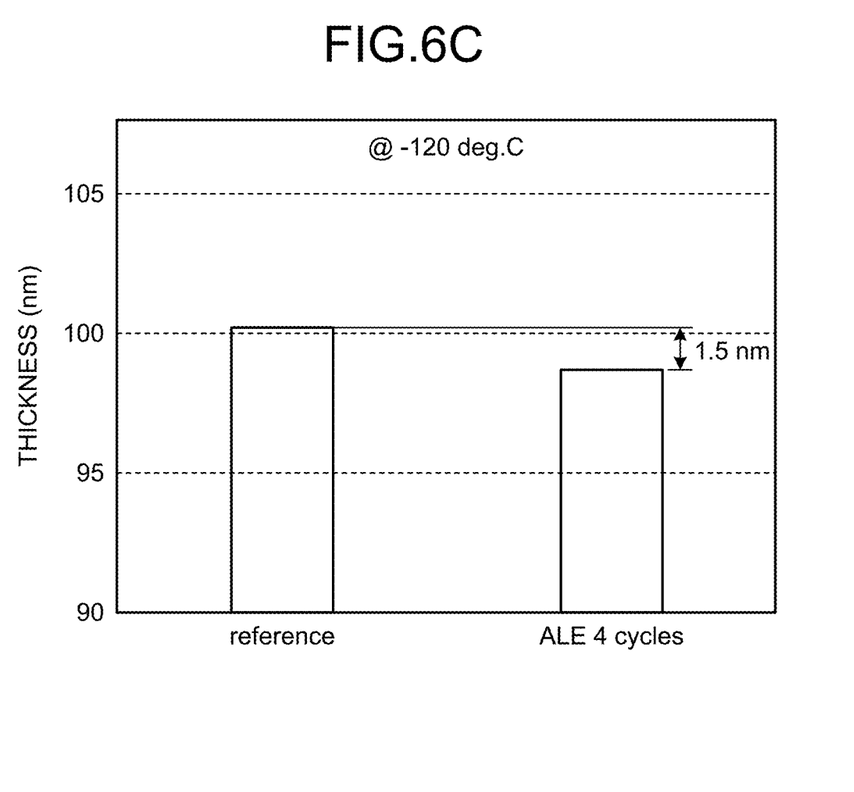
FIG. 6C is a schematic illustrating a measurement result of the etch amount of a silicon oxide film, after the cycle of the physisorption step, the adjustment step, and the etching step was repeated four times, in the order listed herein, with the wafer cooled to −120° C.

A relation between the temperature of the wafer W, and the etched amount of the silicon oxide film 203 will now be explained with reference to FIGS. 6A to 6C. FIG. 6A is a schematic illustrating a measurement result of the etched amount of the silicon oxide film 203, when a cycle of the physisorption step, the adjustment step, and the etching step was repeated four times, in the order listed herein, with the wafer W cooled to −50° C. FIG. 6B is a schematic illustrating a measurement result of the etched amount of the silicon oxide film 203, when the cycle of the physisorption step, the adjustment step, and the etching step was repeated four times, in the order listed herein, with the wafer W cooled to −110° C. FIG. 6C is a schematic illustrating a measurement result of the etched amount of the silicon oxide film 203, when the cycle of the physisorption step, the adjustment step, and the etching step was repeated four times, in the order listed herein, with the wafer W cooled to −120° C. In FIGS. 6A to 6C, "reference" indicates the initial thickness of the silicon oxide film 203, "ALE 4 cycles" indicates the thickness of the silicon oxide film 203 after the cycle of these steps was repeated four times, in the order listed herein.

As illustrated in FIG. 6A, when the temperature of the wafer W was −50° C. that is higher than the dew point of C4F8, the silicon oxide film 203 was etched by an amount of 0.2 nm. This etched amount did not satisfy a predetermined specification of allowance.

Furthermore, as illustrated in FIG. 6B, when the temperature of the wafer W was −110° C. that is higher than the dew point of C4F8, the silicon oxide film 203 was etched by an amount of 0.1 nm. This etched amount did not satisfy the predetermined specification of allowance.

By contrast, as illustrated in FIG. 6C, when the temperature of the wafer W was −120° C. that is lower than the dew point of C4F8, the silicon oxide film 203 was etched by an amount of 1.5 nm. This etched amount satisfied the predetermined specification of allowance.

Figure 10:
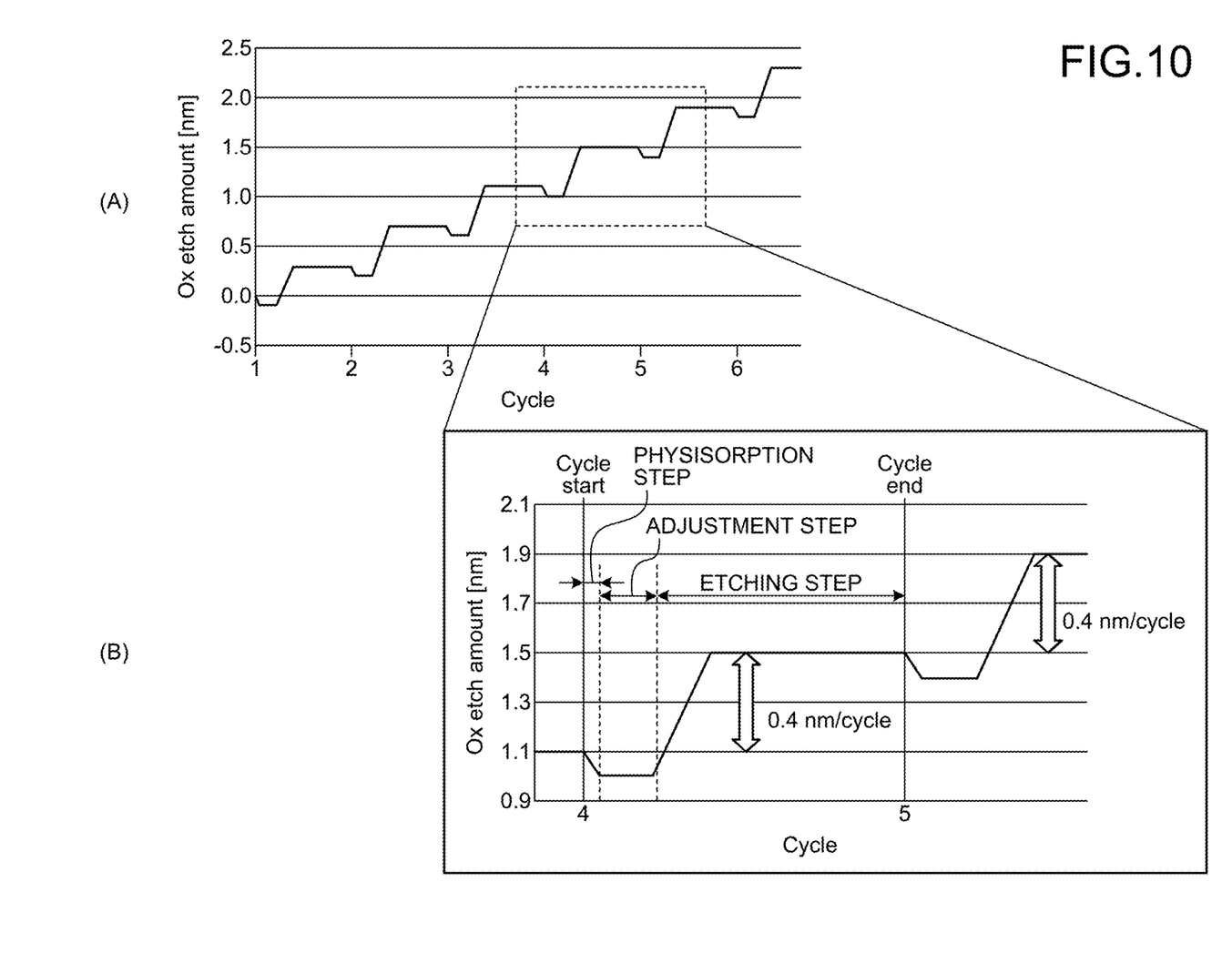
FIG. 10 is a schematic illustrating a measurement result of the etch amount of the silicon oxide film, after the cycle of the physisorption step, the adjustment step, and the etching step was repeated a plurality of times, in the order listed herein, with the wafer cooled to −120° C.

A change in the etched amount of the silicon oxide film 203, after the cycle of the physisorption step, the adjustment step, and the etching step was repeated a plurality of times, in the order listed herein, with the wafer W cooled to −120° C., will now be explained with reference to FIG. 10. FIG. 10 is a schematic illustrating a result of measuring the change in the etched amount of the silicon oxide film 203, after the cycle of the physisorption step, the adjustment step, and the etching step was repeated a plurality of times, in the order listed herein, with the wafer W cooled to −120° C. FIG. 10(A) illustrates a graph indicating the change in the etched amount of the silicon oxide film 203. FIG. 10(B) illustrates an enlargement of the part of the graph corresponding to the fourth cycle in the graph FIG. 10(A).

As illustrated in FIG. 10(A), when the temperature of the wafer W was −120° C. that is lower than the dew point of C4F8, the etched amount of the silicon oxide film 203 increased at a constant rate, and then saturated in every cycle. In other words, it was confirmed that the self-limiting etching was implemented when the temperature of the wafer W was −120° C. that is lower than the dew point of C4F8.

Furthermore, as illustrated in FIG. 10(B), the amount by which the silicon oxide film 203 was etched per one cycle was 0.4 nm. In the silicon oxide film 203, because the distance between atoms in Si—O bonding is 1.6 to 1.7 angstroms, for example, 0.4 nm corresponds to approximately two atomic layers. In other words, it was confirmed that the silicon oxide film 203 was etched successfully in a unit of one atomic layer, when the temperature of the wafer W was −120° C. that is lower than the dew point of C4F8.

Figure 7:
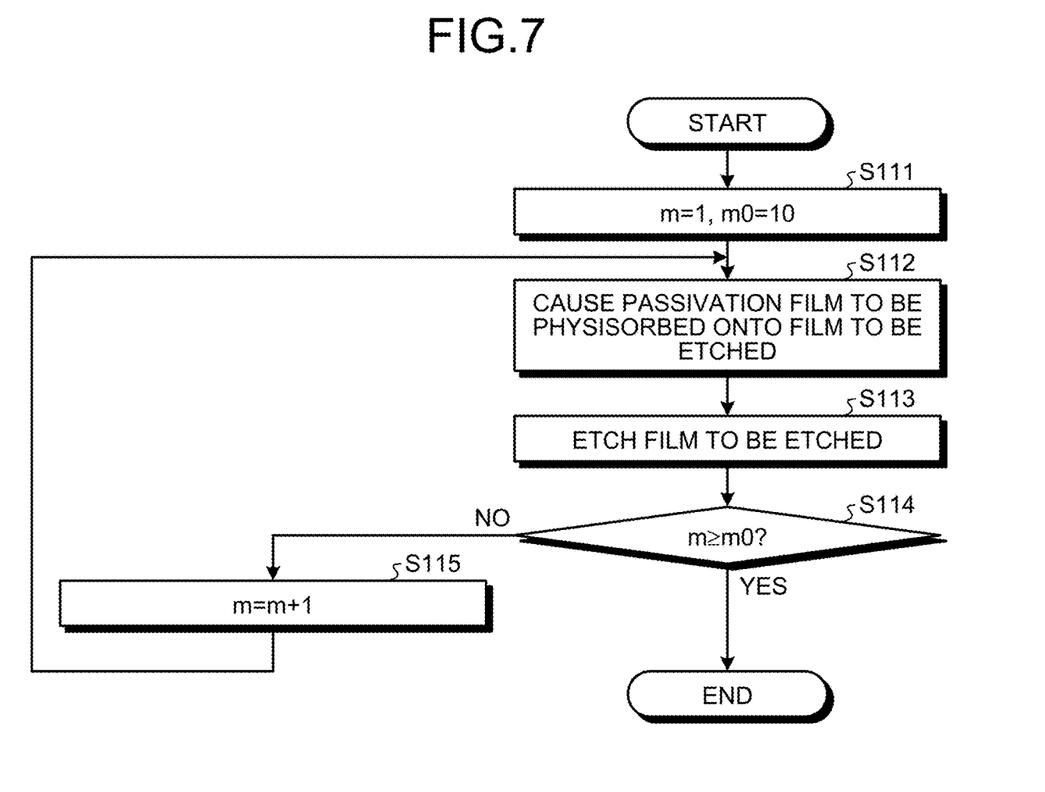
FIG. 7 is a flowchart illustrating another example of the sequence of the process of the plasma etching method according to one embodiment.
Figure 8:
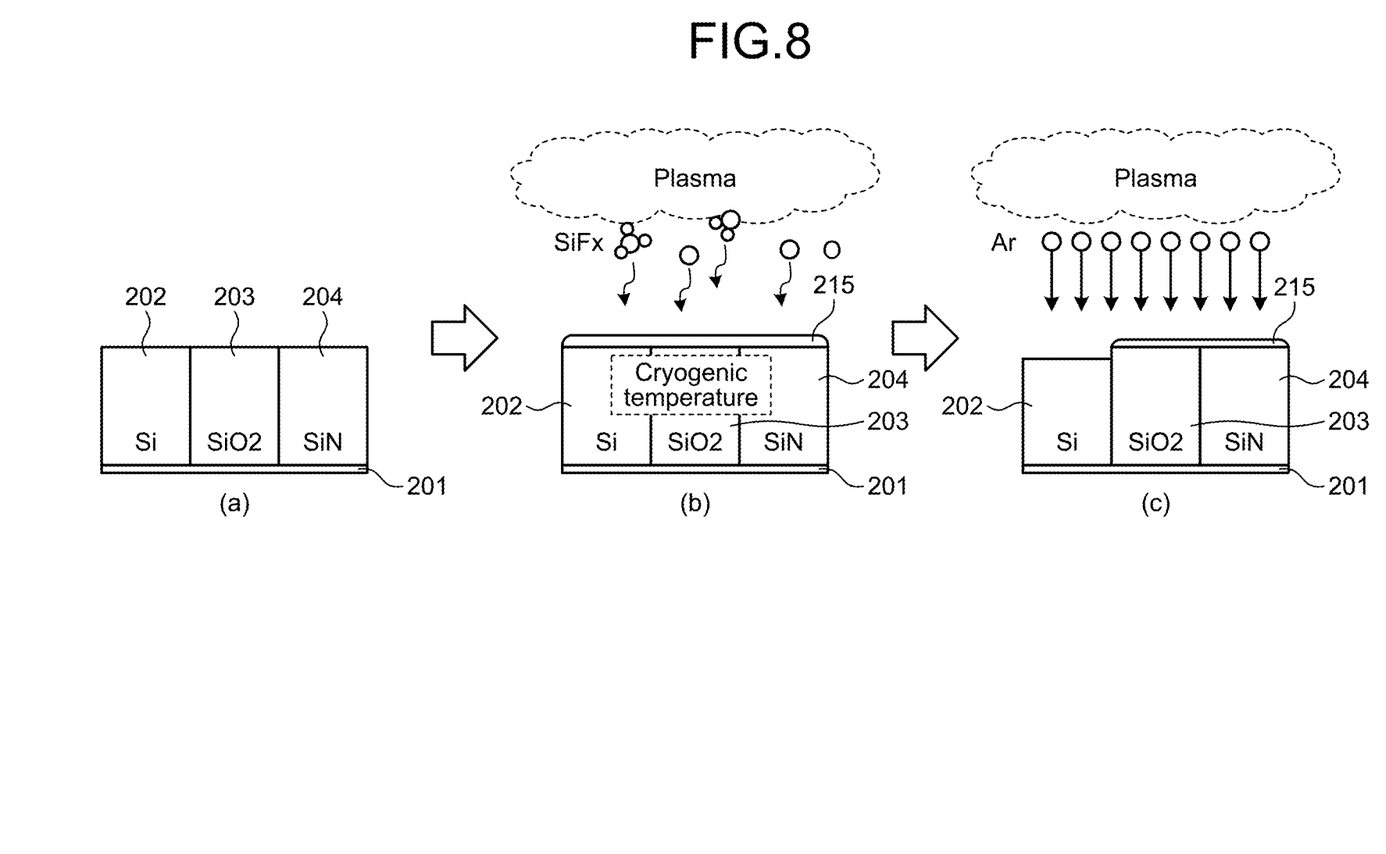
FIG. 8 is a schematic illustrating one example of a cross section of the wafer after the execution of the steps illustrated in FIG. 7.

Another example of the sequence of the process of the plasma etching method executed by the plasma etching apparatus 10 will now be explained. FIG. 7 is a flowchart illustrating another example of the sequence of the process of the plasma etching method according to one embodiment. FIG. 8 is a schematic illustrating one example of a cross section of the wafer W after the execution of the steps illustrated in FIG. 7. In the explanation below, it is assumed that the plasma etching apparatus 10 executes a series of steps to the wafer W illustrated in FIG. 2.

In the plasma etching method according to the embodiment, to begin with, the wafer W that is the object to be processed is carried into the chamber 12c, and placed on the stage 16. At this point in time, the cross section of the wafer W is as illustrated in FIG. 8(a), for example.

The plasma etching apparatus 10 then sets values to the parameter m for counting the number of times the steps are repeated, and the parameter m0 specifying the upper bound of the number of times the steps are repeated. The plasma etching apparatus 10 sets "1" to the parameter m, for example, and sets "10" to the parameter m0, for example (Step S111). The value set to the parameter m0 may be any value. When the value set to the parameter m0 is "1", for example, the physisorption step and the etching step are performed once, without repeating the steps.

The plasma etching apparatus 10 then execute a physisorption step for causing a passivation film that is based on the first processing gas to be physisorbed onto the film to be etched, as the adsorbate, while cooling the wafer W to a temperature equal to or lower than the sublimation point of the first processing gas (Step S112). The film to be etched is, for example, the silicon film 202 on the wafer W. The first processing gas includes, for example, gas including halogen and oxygen. Examples of the gas including halogen and oxygen are SiF4/O2 and Si2F6/O2. It is considered that the physisorption between the passivation film based on the first processing gas and the film to be etched takes place due to van der Waals force, for example. Van der Waals force is a force by which molecules or atoms are attracted to one another, and the effect of this force becomes greater when the temperature of the molecules or the atoms becomes lower. Therefore, even when the film to be etched does not have any chemical reactivity to the first processing gas, by cooling the wafer W to a temperature equal to or lower than the sublimation point of the first processing gas, the passivation film that is based on the first processing gas is caused to be physisorbed onto to the film to be etched, by van der Waals force.

This step will now be explained using a more specific example. The control unit 70 in the plasma etching apparatus 10 cools the wafer W to a temperature equal to or lower than the sublimation point of SiF4/O2 that is the first processing gas (hereinafter, referred to as "cryogenic temperature", as appropriate), by controlling the temperature of the refrigerant circulating through the flow channel 18f inside the stage 16. The control unit 70 then causes the gas source group 40 to supply SiF4/O2 into the chamber 12c as the first processing gas, while keeping the wafer W at the cryogenic temperature, and generates SiF4/O2 plasma by causing the first high-frequency power source 62 to apply the first high-frequency power for plasma generation. At this time, the control unit 70 may also cause the second high-frequency power source 64 to apply the second high-frequency power for drawing ions. As a result, an oxide film that is the passivation film based on SiF4/O2 is caused to be physisorbed onto the film to be etched, by van der Waals force, in a unit of one atomic layer.

The cross section of the wafer W after the execution of the physisorption step illustrated as Step S112 is as illustrated in FIG. 8(b), for example. In other words, by the SiF4/O2 plasma being generated while the wafer W is cooled to the cryogenic temperature, the physisorption of an oxide film 215 that is SiF4/O2-based passivation film is caused to be physisorbed onto the silicon film 202 that is the film to be etched. Because the entire wafer W is cooled to the cryogenic temperature, the oxide film 215 that is based on SiF4/O2 is caused to be physisorbed not only onto the silicon film 202 but also onto the silicon oxide film 203 and the silicon nitride film 204.

The plasma etching apparatus 10 then executes the etching step for etching the film to be etched, by causing the adsorbate to react with the film to be etched, using the plasma of the second processing gas (Step S113). The second processing gas includes noble gas, for example. The noble gas is Ar, for example.

This step will now be explained using a more specific example. The control unit 70 in the plasma etching apparatus 10 causes the gas source group 40 to supply Ar into the chamber 12c, as the second processing gas, so as to replace SiF4/O2 with Ar, and generates Ar plasma by causing the first high-frequency power source 62 to apply the first high-frequency power for generating plasma. At this time, the control unit 70 may also cause the second high-frequency power source 64 to apply the second high-frequency power for drawing ions. As the Ar plasma is generated, this plasma promotes the collisions of ions (that is, Ar ions) against the adsorbate on the film to be etched, and induces a reaction between the adsorbate and the film to be etched. As a result, the film to be etched is etched in a unit of one atomic layer, depending on the thickness of the adsorbate.

The cross section of the wafer W after the etching step illustrated at Step S113 is as illustrated in FIG. 8(c), for example. In other words, as the reaction between the silicon film 202 and the oxide film 215 on the silicon film 202 that is the film to be etched is induced, the silicon film 202 becomes etched selectively, by the thickness corresponding to the thickness of the oxide film 215. By contrast, the silicon oxide film 203 and the silicon nitride film 204, which are not to be etched, have higher bond-dissociation energy than that of the silicon film 202, therefore, reactions of the silicon oxide film 203 and the silicon nitride film 204, with the oxide film 215 are suppressed. For this reason, etching of the silicon oxide film 203 and the silicon nitride film 204 is suppressed.

The plasma etching apparatus 10 then determines whether the physisorption step and the etching step have been repeated by the preset number of times, that is, whether the parameter m is equal to or greater than the parameter m0 (Step S114). If the parameter m is less than the parameter m0 (No at Step S114), the plasma etching apparatus 10 increments the parameter m by one (Step S115), shifts the process back to Step S112, and repeats the physisorption step and the etching step. If the parameter m is equal to or greater than the parameter m0 (Yes at Step S114), the plasma etching apparatus 10 ends the process.

The order of the steps illustrated in FIG. 7 is not limited to that described above, and may be changed as appropriate, within the scope in which the steps do not contradict one another. For example, the control unit 70 may execute an adjustment step for adjusting the thickness of the adsorbate, by evaporating or subliming a part of the adsorbate having been physisorbed onto the film to be etched, between the physisorption step and the etching step.

Figure 9:
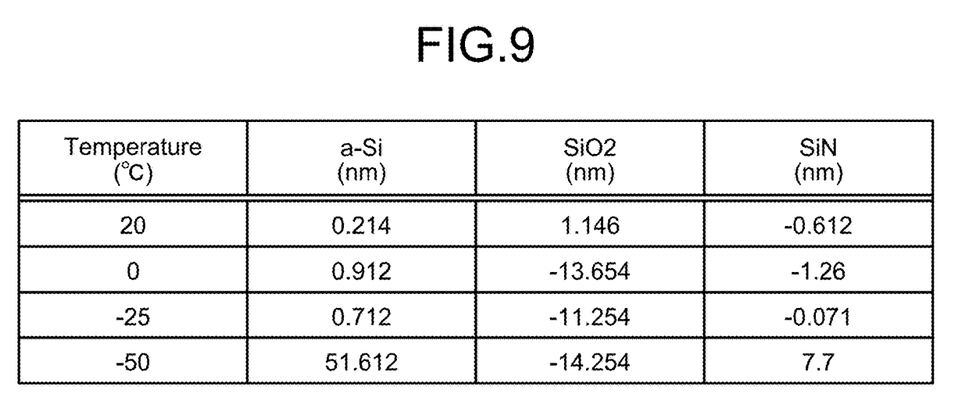
FIG. 9 is a schematic illustrating one example of relations between the temperatures to which the wafer W is cooled at the physisorption step, and etched amounts of a silicon film, a silicon oxide film, and a silicon nitride film.

FIG. 9 is a schematic illustrating one example of a relation between the temperature of the wafer W cooled at the physisorption step, and the etched amounts of the silicon film 202, the silicon oxide film 203, and the silicon nitride film 204. In FIG. 9, "temperature (° C.)" represents the temperature (° C.) of the wafer W cooled at the physisorption step. In FIG. 9, "a-Si (nm)" represents the amount (nm) by which the silicon film 202 was etched, "SiO2 (nm)" represents the amount (nm) by which the silicon oxide film 203 was etched, and "SiN (nm)" represents the amount (nm) by which the silicon nitride film 204 was etched.

As illustrated in FIG. 9, when the wafer W was cooled to −50° C., the etch amount of the silicon film 202 increased to 51.612 (nm). By contrast, the etch amounts of the silicon oxide film 203 and the silicon nitride film 204 were smaller than that of the silicon film 202. This can be attributed to the fact that the silicon oxide film 203 and the silicon nitride film 204 have higher bond-dissociation energy than that of the silicon film 202.

As described above, according to the embodiment, an adsorbate that is based on the first processing gas is caused to be physisorbed onto a film to be etched, while cooling object to be processed on which the film to be etched is provided, and the film to be etched is etched by causing the adsorbate to react with the film to be etched, using plasma of the second processing gas. Therefore, it is possible to remove the limitation imposed on the selectable film to be etched to the that made of substance having chemical reactivity to the first processing gas, and to control the etch amount of the film to be etched easily, in a unit of one atomic layer, based on the thickness of the adsorbate. As a result, an implementation of self-limiting etching, with no limitation on the film to be etched is made possible.

REFERENCE SIGNS LIST 10 plasma etching apparatus
12 chamber main body
12c chamber
16 stage
18 lower electrode
18f flow channel
20 electrostatic chuck
40 gas source group
50 exhaust device
62 first high-frequency power source
64 second high-frequency power source
70 control unit

The invention claimed is:
1. A plasma etching method comprising:
a physisorption step for causing an adsorbate that is based on first processing gas to be physisorbed onto a film to be etched, while cooling an object to be processed on which the film to be etched is provided;
adjusting a thickness of the adsorbate, by evaporating or subliming a part of the adsorbate having been physisorbed onto the film to be etched; and an etching step for etching the film to be etched, by causing the adsorbate to react with the film to be etched, using plasma of second processing gas.

2. The plasma etching method according to claim 1, wherein the physisorption step and the etching step are repeated alternatingly a plurality of times.

3. The plasma etching method according to claim 1, wherein, at the physisorption step, the adsorbate that is based on the first processing gas is caused to be physisorbed onto the film to be etched, while cooling the object to be processed to a temperature equal to or lower than a dew point of the first processing gas.

4. The plasma etching method according to claim 3, wherein
the film to be etched is a silicon oxide film, and
the first processing gas includes fluorocarbon gases that do not contain hydrogen.

5. The plasma etching method according to claim 1, wherein, at the physisorption step, a passivation film based on the first processing gas is caused to be physisorbed onto the film to be etched, as the adsorbate, while cooling the object to be processed to a temperature equal to or lower than a sublimation point of the first processing gas.

6. The plasma etching method according to claim 5, wherein the film to be etched is a silicon film, and
the first processing gas includes gas including halogen and oxygen.

7. The plasma etching method according to claim 1, wherein the second processing gas includes noble gas.

* * * * *